United States Patent [19]
Potter et al.

[11] Patent Number: 5,771,873
[45] Date of Patent: Jun. 30, 1998

[54] CARBONACEOUS DEPOSIT-RESISTANT COATING FOR ENGINE COMPONENTS

[75] Inventors: Timothy J. Potter, Dearborn; Xia Zhang, Canton; William Vassell, Bloomfield Hills; Michael R. Rigley, Westland; Robert E. Hetrick, Dearborn Heights, all of Mich.

[73] Assignee: Ford Global Technologies, Inc., Dearborn, Mich.

[21] Appl. No.: 837,679

[22] Filed: Apr. 21, 1997

[51] Int. Cl.⁶ ............................................. F01L 1/14
[52] U.S. Cl. ..................................................... 123/668
[58] Field of Search .................................. 123/657, 668, 123/670

[56] References Cited

U.S. PATENT DOCUMENTS

| | | | |
|---|---|---|---|
| 4,811,701 | 3/1989 | Buhl et al. | 123/188.3 |
| 5,237,967 | 8/1993 | Willermet et al. | 123/90.51 |
| 5,249,554 | 10/1993 | Tamor et al. | 123/90.51 |
| 5,309,874 | 5/1994 | Willermet et al. | 123/90.51 |

FOREIGN PATENT DOCUMENTS 0435312  12/1990  European Pat. Off. .

OTHER PUBLICATIONS

SAE Technical Paper No. 902105, "Deposits In Gasoline Engines—A Literature Review", by Gautam T. Kalghatgi, Oct. 22–25, 1990, pp. 1–29.

"Network Modification Of DLX Coatings To Adjust A Defined Surface Energy", by K. Trojan et al, Network Modification of DLC Coatings, pp. 575–585, Jan. 1994.

"Technical Challenges Of Chemical Vapor Deposited Diamond And Diamondlike Carbon Films", by C.H. Wu et al, pp. 101–136, Jan. 1994.

Primary Examiner—David A. Okonsky
Attorney, Agent, or Firm—Damian Porcari; Roger L. May

[57] ABSTRACT

An engine component such as an intake or exhaust valve, or any other component near or within the combustion chamber, is coated with an amorphous hydrogenated carbon film coating to prevent the formation of carbonaceous deposits thereon. Methods for forming the film coating are also disclosed.

18 Claims, 2 Drawing Sheets ns. 5,771,873

CARBONACEOUS DEPOSIT-RESISTANT COATING FOR ENGINE COMPONENTS

TECHNICAL FIELD

This invention is related to a method of preventing the formation of carbonaceous deposits on engine components with the use of an amorphous hydrogenated carbon coating thereon.

BACKGROUND

Coking or the growth of hard carbonaceous deposits on components near or within the combustion chamber of internal combustion engines has been a long-standing problem. The buildup of deposits in this region can alter engine performance by impairing fuel economy, regulated emissions, and driveability, and in the worst case scenario cause engine damage. A detailed account of such deposits, problems and some attempted solutions can be found in S.A.E. Technical Paper No. 902105 (1990) by G. T. Kalghatgi.

Among the components near or within the combustion chamber, carbonaceous deposits which form on the surfaces of the intake and exhaust valves, the intake port, and the surfaces on the combustion chamber head and the top of the piston, pose a particular problem. Carbonaceous deposits, for example on engine intake and exhaust valves, as well as other combustion chamber components, have profound negative effects with respect to startability, cold start emissions and cold engine driveability of an automobile. Reduction of these deposits would help reduce regulated emissions and preserve a cold start fueling strategy at high mileage.

Since the intake valve deposits act like a sponge to retain fuel injected into the intake port, at cold start, such deposits may prevent efficient evaporation of the fuel and inhibit or negatively impact startability. This may be especially important in terms of regulated hydrocarbon emissions at cold start where one would have to over-fuel to compensate for the deposits to achieve sufficient vapor to start the engine. As the engine warms, but before the exhaust catalyst is fully warmed, the excess fuel absorbed by the carbonaceous deposits may find its way out the exhaust system as unburned hydrocarbons. Over-fueling at cold start is already required to achieve a prompt start. This over-fueling is a well-established cause of hydrocarbon emissions during this period. As valve deposits accumulate during engine operation, additional over-fueling may be required to achieve cold start, with a corresponding increase in emissions. As a result, the reduction of deposits plays an important role in the reduction of regulated emissions, especially hydrocarbon emissions.

In addition to emissions considerations, an increase of deposits on both the intake and exhaust valves may result in poor closure of the valves, leading to engine malfunction. Likewise, intake system deposits may restrict the air flow into the engine and cause a loss of power and acceleration.

Inside the combustion chamber, deposits may result in premature combustion and engine "knock". Physically porous carbon deposits of low thermal conductivity may heat up rapidly on compression causing ignition. Premature combustion may necessitate a reduction of the compression ratio of the engine with an attendant reduction of fuel economy.

In the past, components have been coated to increase hardness and durability, decrease friction and wear and protect against corrosion. As described in U.S. Pat. Nos. 5,249,554, 5,309,874 and 5,237,967, assigned to Ford Motor Company, and incorporated herein for reference, powertrain components have been coated with carbon film coatings to reduce friction and wear related thereto.

More recently, coatings have also been applied in an effort to reduce deposit formation. One example is U.S. Pat. No. 3,552,370, issued to Briggs et al, which describes a coating, and method of application, including the constituents of nickel, aluminum and copper for the purpose of reducing heat transfer from the combustion chamber to foster a more complete combustion. In the Briggs patent, a thermal mechanism is utilized preventing deposits. Under this thermal approach, the higher temperature of the coated component promotes combustion rather than deposit of hydrocarbon species. If the coating is used inside the combustion chamber, however, care must be taken with this approach so that the coated surface does not heat to an excessive temperature. If this occurs, the excessively hot coating itself might cause premature combustion. Accordingly, for the prevention of carbonaceous deposits near or in the proximity of the combustion chamber, deposit prevention using a thermal mechanism has significant limitations.

Another approach for preventing deposits is a chemical method. Under this approach, a coating is supplied by which the precursor molecules for forming a deposit cannot chemically bond to the surface. An example of this approach is a Teflon® coating. However, Teflon® coatings, in particular, are unsuited for application on many engine components due to the high temperature and high hardness properties required for use in an internal combustion engine.

There thus remains a need for a method of reducing and preventing the growth of carbonaceous deposits on components near or within the combustion chamber.

SUMMARY OF THE INVENTION

Accordingly, an object of the present invention is to prevent the formation of carbonaceous deposits on engine components. Another object of the present invention is to provide a coating for engine components which reduces hydrocarbon emissions. Yet another object of the present invention is to provide a coating for engine components which preserves a cold-start fueling strategy.

In carrying out the above objects, a method is disclosed for providing a deposit resistant coating for an engine component, including the steps of: preparing the surface of the engine component to create an adherent surface; applying an amorphous hydrogenated carbon film coating to the engine component, wherein the film coating is one of the following: amorphous hydrogenated carbon or doped amorphous hydrogenated carbon.

The invention also discloses an engine component in an internal combustion engine, including a film coating the engine component, wherein the film coating is amorphous hydrogenated carbon, or doped amorphous hydrogenated carbon.

DETAILED DESCRIPTION OF THE INVENTION

Figure 1:
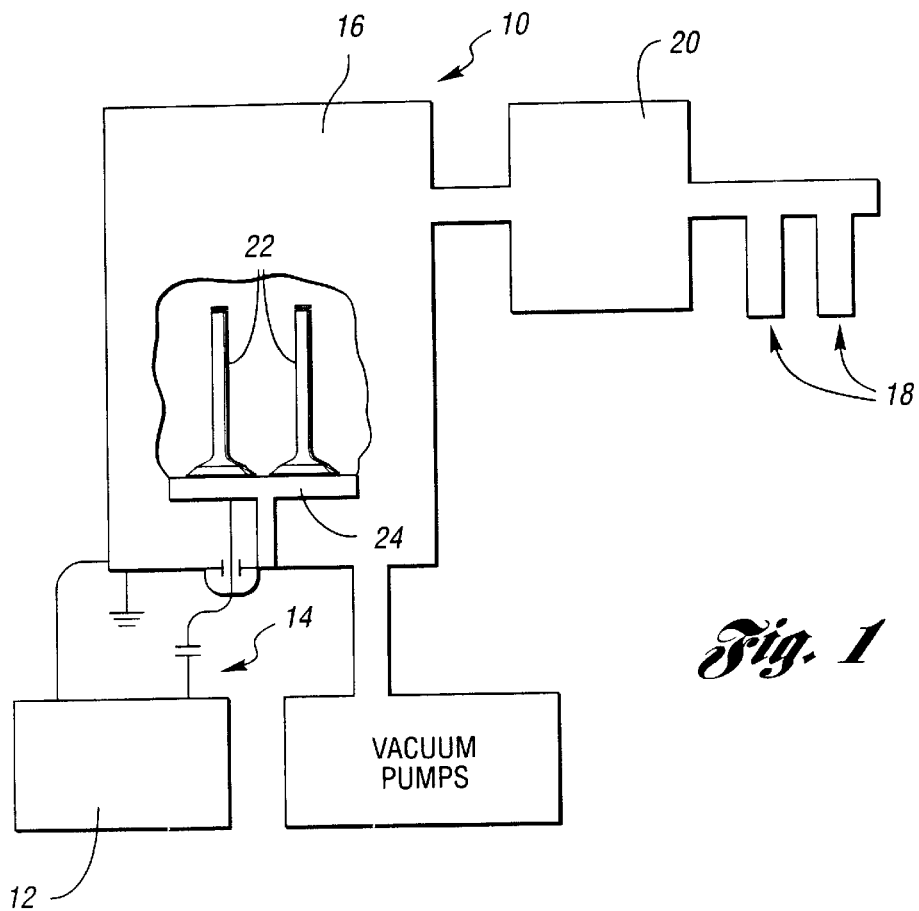
FIG. 1 illustrates one embodiment of a schematic diagram of a vacuum apparatus and associated equipment for applying the coating of AHC by a plasma enhanced, chemical vapor deposition (PE-CVD) method that employs radio frequency techniques.

The term "engine component" as used herein is intended to include all components near or within the combustion chamber of an internal combustion engine which have surfaces on which carbonaceous deposits may form. Such engine components include, but are not limited to, the intake manifold, intake port, intake and exhaust valves as well as surfaces within the combustion chamber that are subject to deposition, including but not limited to, the top of the piston, the portion of the engine head that is exposed in the combustion chamber and surfaces of various components that are mounted in the engine head and exposed to the combustion chamber such as spark plugs and fuel injectors in the case of direct injection spark-ignited engines.

The present invention serves to provide an amorphous hydrogenated carbon (AHC) coating for engine components which prevents or minimizes the accumulation of carbonaceous deposits thereon. This coating specifically prevents deposit formation on surfaces which either diminish optimum engine performance in terms of regulated emissions or mileage or whose anticipated deposition during normal operation requires design modifications or calibration adjustments that compromise optimum engine performance.

Accordingly, those surfaces which are susceptible or prone to deposit formation are coated with the amorphous hydrogenated carbon coating disclosed in this invention. As one example, an intake valve, could be coated, on two surfaces, the surface exposed to the intake port, as well as the surface exposed to the combustion chamber to reduce deposits in these regions. Similarly, the top of the piston and the portion of the engine head that is exposed in the combustion chamber are surfaces susceptible or prone to deposit formation and thus surfaces which could be coated with the AHC film of this invention.

While not wishing to be bound to any particular theory, it is believed that the amorphous hydrogenated carbon coating serves to prevent the formation of carbonaceous deposits because the surface of the coating is chemically inert with respect to deposit formation chemistry. Moreover, the AHC coating of the present invention is sufficiently hard to withstand application inside the combustion chamber.

Unlike crystalline diamond films, hydrogenated carbon films are devoid of crystallinity, are amorphous in nature and have very smooth surfaces which impart a low coefficient of friction. Hydrogenated carbon films are utilized because of their high hardness and wear resistant properties. Hydrogenated carbon films are believed to consist of isolated $sp^2$ carbon-carbon bonded clusters. These clusters may be linked by an $sp^3$ carbon-carbon bond to form a rigid three-dimensional structure. Due to its structure, the film imparts low friction and wear resistance to its underlying substrate. At low relative humidity, hydrogenated carbon films exhibit friction coefficients in the range of 0.05–0.16 under a contact stress ranging from 0.83 to 1.5 GPa at a sliding speed ranging from 0.03 to 1 meter per second.

The use of a carbon based film creates a hard coating with a low coefficient of friction. A diamond-like carbon-based film imparts hardness properties, while a graphite or amorphous carbon-based film imparts lubricant properties. Accordingly, in the preferred embodiment the amorphous carbon includes a dopant to alter the process such that the resultant carbon film is sufficiently hard and deposit resistant.

The film coating of the present invention, which creates a deposit resistant coating, can be selected from the following group of amorphous hydrogenated carbon and doped hydrogenated carbon. The list of possible dopants include, but are not limited to, tantalum, titanium, tungsten, niobium, silicon, boron, nitrogen, oxygen and fluorine. The preferred film coating for engine components is a silicon-doped amorphous hydrogenated carbon film coating.

Silicon-doped amorphous hydrogenated carbon is the preferred film coating due to its increased hardness—a characteristic of silicon-carbide. The addition of silicon in the film coating formation process allows carbon to bond with silicon to create a carbon-hydrogen-silicon film coating with sufficient hardness. While silicon-doped amorphous hydrogenated carbon film is the preferred film coating, other amorphous hydrogenated carbon film coatings demonstrate resistance to the formation of deposits and may be used as well.

The amorphous hydrogenated carbon film is formed from a hydrocarbon source, such as, for example: ethane, ethylene, acetylene, methane, butane, propane, hexane, benzene, toluene, and xylene.

An amorphous hydrogenated carbon film of the present invention preferably has up to 20–60 atomic percent of hydrogen and most preferably between 35 and 50 atomic percent of hydrogen to achieve a low coefficient of friction. The AHC film coating preferably is 200 angstroms to 10 microns in thickness. Most preferably, the AHC coating has a thickness between 2 and 4 microns.

AHC Coatings, especially on the order of a few micrometers in thickness can substantially reduce component wear as well as reduce friction among rubbing components especially in oil deprived conditions. These AHC films have high hardness and low friction against many technologically important surfaces including steel which serves to increase the wear resistance of the surface. It is further understood that the addition of silicon to the coating serves to reduce compressive stress within the coating which is beneficial for improving adhesion to the substrate.

The amorphous hydrogenated carbon films of the present invention can be applied by various techniques, including direct current, radio frequency, plasma-assisted chemical vapor deposition, ion beam deposition and arc discharge techniques. While a number of different methods may be used to deposit these coatings onto a substrate, a preferred deposition method, involves a low pressure, plasma enhanced, chemical vapor deposition (PE-CVD) technique.

As provided in FIG. 1, this low pressure, in the order of 1–100 milliTorr, technique is carried out in a vacuum chamber 10 where an RF power supply 12 is capacitively coupled with a coupling capacitor 14 to electrodes whose electrical activation sustains the plasma 16 among appropriate precursor gases 18 admitted to the vacuum chamber 10 through a gaseous flow rate controller 20. One electrode is the substrate 22 to be coated, shown schematically as two engine valves, in combination with a support structure 24, while the other electrode in the simplest case, is the grounded wall of the vacuum system which surrounds, but is electrically insulated from the substrate 18.

The precursor gases include at least one hydrocarbon species such as methane or other hydrocarbon gases to form the amorphous hydrogenated carbon. Other gaseous constituents can be included in appropriate proportions, for example, gases of silicon compounds can be included to provide a silicon dopant for the AHC film coating. Examples of the gases of silicon compounds include those of silicon tetrachloride, $SiCl_4$, silicon tetrafluoride, $SiFl_4$, trichlorosilicon, $SiHCl_3$, and tetramethylsilicon, $Si-(CH_3)_4$.

In operation, the different electrical mobilities of the electrons and ions formed within the plasma results in the development of the negative potential on the substrate relative to the plasma, a "self bias" which acts to beneficially accelerate positive species composed of ionized precursors or gas constituents to the substrate where they react to form the desired coating. Important coating properties such as hardness, coefficient of friction, internal stress (effecting adhesion) and the like are a function of the self bias potential. The self bias, which is not strictly a DC potential but has an alternating component at the applied RF frequency, is itself a function of many process parameters including pressure, gas composition, electrode shape, and the like, and is measured approximately during operation by measuring the potential between the substrates and ground. Optimum coating properties such as hardness, wear and coefficient of friction were found for self bias potential in the range from 200 V to 800 Vrms, which corresponds to an average kinetic energy for carbon ions impacting the substrate of between 50 to 200 electron Volts.

The PE-CVD technique is particularly advantageous for a number of reasons. First, it is a conformal technique in that the plasma surrounds or conforms to the surface of the substrate which acts as one of the electrodes for exciting the plasma. As a result, a complex surface may be coated without resorting to a rotation of the substrate which is often required for uniform coating when a unidirectional ion beam coating technique is utilized. With such beam coatings, the spatial requirements for a large vacuum system and mechanical rotational apparatus, for establishing rotation with respect to the beam, especially one that is economically desirable for simultaneous coating of a large number of parts, renders beam techniques impractical from a cost view.

In addition, the PE-CVD approach can be accomplished while expending a small amount of power per unit surface area of substrate at a substrate temperature which may be constrained in the range of 100° C. to 200° C. In view of the temperature range by which the deposition can be achieved, thermal distortions of the components, in particular the distortion the critical dimensions of these components, can be avoided.

With previous methods for the application of amorphous hydrogenated carbon films as provided in U.S. Pat. Nos. 5,237,967, 5,249,554, and 5,309,874, assigned to the Ford Motor Company, such patents pointed out that an interlayer or a film with graded composition is preferred to achieve satisfactory adhesion of amorphous hydrogenated carbon films to ferrous metal parts, including all steel parts. As provided in the patents, this interlayer is generally achieved by physical vapor deposition (PVD), such as magnetron sputtering of an interlayer of chromium, aluminum, titanium, titanium nitride (TiN), or silicon. This added physical vapor deposition step requires additional equipment and processing. In addition, this PVD step is a line-of-site process that makes coating parts with complex shapes difficult and even impossible in some cases, and limits the number of parts that can be closely packed and stacked inside the process chamber.

In an effort to address some of these problems, in the most preferred embodiment, a silicon-containing amorphous hydrogenated carbon film is deposited as an interlayer by plasma deposition using tetraethoxysilane [TEOS, $(C_2H_5O)_4Si$] as a precursor. This interlayer deposition method involves the step of cleaning the parts using chemical cleaning techniques and argon sputtering cleaning in a vacuum chamber. Second, the TEOS is introduced in the process chamber by using a heated low-vapor-pressure liquid delivery system as a precursor gas. By applying RF power to the parts, a reactive plasma is then generated and the Si-AHC film is then deposited from the ions drawn from the plasma to the parts by the bias potential. The Si-AHC film is then deposited as provided in the aforementioned U.S. patents assigned to the Ford Motor Company and directed to the application of a silicon-containing amorphous hydrogenated carbon film to finish the coating process.

Moreover, the TEOS interlayer deposition method uses the plasma process used for Si—AHC deposition, a conformal coating process. This deposition method simplifies the equipment set up and streamlines the process procedure by not requiring magnetron sputtering and a sample rotation system. Moreover, this interlayer deposition method provides improved production efficiency and reduces the inherent costs by enabling simultaneous coating of multiple parts. As a result, plasma deposition of an interlayer film from tetraethoxysilane (TEOS) precursor improves the adhesion of silicon-containing amorphous hydrogenated carbon coating on steel and other ferrous automotive components. With this preferred plasma deposition method, there is provided an interlayer that can be conformally coated by a plasma process which replaces the sputter chromium interlayer, a line-of-site process, that is presently used. With this preferred plasma deposition interlayer process, parts with complicated shapes can be coated with simpler equipment and process requirements with higher output.

In a test using the most preferred interlayer deposition method, a steel disk and engine intake valve were coated with 5,000 Angstroms of the Si—AHC film using TEOS as an interlayer, followed by a deposition of the two micrometer Si—AHC coating. The Si—AHC film provided good adhesion of Si—AHC films to steel and silicon substrates and thus evidences the beneficial adhesion characteristics associated with this interlayer deposition method.

It should be noted that in general it is desirable to hold the temperature of the "substrate", in this case, engine components, to as low of a value as possible during the coating or post-coating processes. This will reduce the potential for thermal distortion of the substrate. Since "tight" tolerances are often desirable in many engine assemblies, it is desirable to keep coating process temperatures as low as possible.

For use as a process control measure, Raman spectroscopy is useful for identifying the film coating of the present invention. The diamond-like structure creates a characteristic structure as seen by Raman spectroscopy which yields a broad band at around 1550 $cm^{-1}$ and a shoulder band at around 1400 $cm^{-1}$.

The AHC coating of this invention can be applied to a variety of substrate materials, including aluminum, magnesium, steel, and other ferrous materials.

Figure 2:
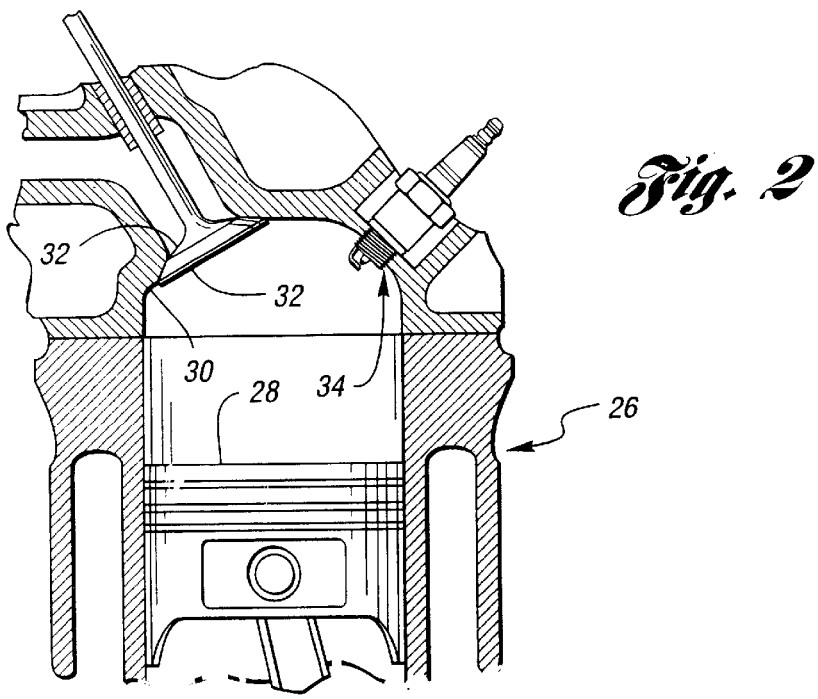
FIG. 2 illustrates one embodiment of a cross-sectional view of an engine including those components such as intake and exhaust valves as well as surfaces within the combustion chamber where it would be useful to reduce carbonaceous deposits.

FIG. 2 shows a cross-sectional view of a portion of an internal combustion engine 26. Several components, or surfaces of a given component, can benefit from a coating that eliminates or reduces the formation of deposits. For example, within the combustion chamber, the piston head 28, the engine head 30, the exposed surfaces of the intake 32, and exhaust valves respectively constitute components on which such a coating would be beneficial. In addition, the surfaces of components mounted on the head which would have an exposure to the combustion chamber such as spark plugs 34 and in some engine designs a fuel injector, constitute additional target components.

The buildup of deposits on any of the aforementioned components can result in engine "knock" and correspondingly reduce performance. In consideration of the possible buildup of such deposits with certain fuel blends and under certain driving conditions, the operating parameters of the engine may be reduced from those values that yield optimum results without the deposits. For example, the compression ratio may be reduced, which results in a corresponding decrease in the gasoline mileage, assuming all other factors remaining the same. The reduction of the compression ratio reduces the temperature rise of the combustible charge during compression and correspondingly the potential for premature ignition of that charge by deposits of low thermal conductivity whose temperature can rise to a high enough value during compression to cause premature ignition of the charge.

Figure 3:
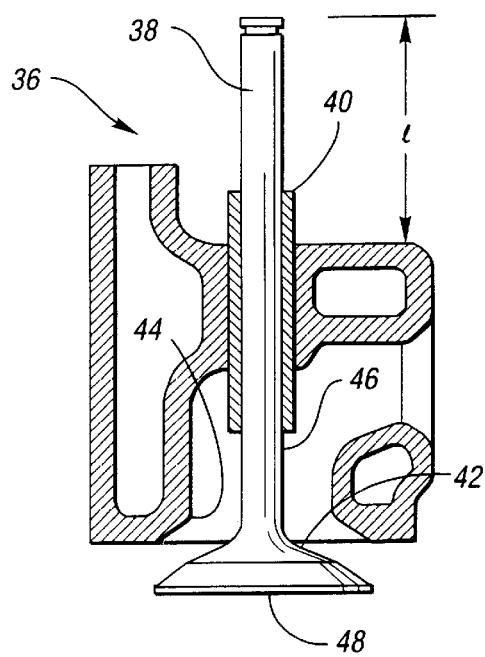
FIG. 3 shows a view of an intake valve illustrating various regions that could benefit from a Si:AHC coating.

FIG. 3 also shows an intake or exhaust valve assembly 36 with the stem of the valve 38 in the valve guide 40 and the head 42 of the valve in proximity to the valve seat 44. In terms of deposit-resistance, the valve head 42 could be coated, on both the side exposed to the intake port 46, as well as the side exposed to the combustion chamber 48 which would reduce deposits in these regions which are harmful to different aspects of engine operation as previously discussed.

In addition, the deposit of the AHC coating on the valve head 42 region which contacts the valve seat 44 on valve closure will eliminate or reduce wear on the valve head in the region of contact. Such wear is well known and is measured by the tip height, as provided by distance 1 as shown in FIG. 3, corresponding to the distance between a fiducial position on the engine and the top, or tip, of the valve stem. Wear in the valve stem 38 or its contacting region on the valve head 42 during engine operation results in an increase in the tip height and degradation of optimum engine performance.

Moreover, coating the valve stem 38 and the region over which the valve stem passes through the valve guide 40, would allow clearance between the guide and the stem to be reduced without increasing overall friction or wear as a result of the low coefficient of friction of the coating. Such a reduction would be desirable to avoid oil leakage through the valve guide into the intake port and subsequently into the combustion chamber where undesirable hydrocarbon emissions may evolve. Accordingly, the AHC coating of the present invention can be applied to different surfaces of an engine component to achieve different beneficial results.

Having generally described this invention, a further understanding can be obtained by reference to certain specific examples which are provided herein for purposes of illustration only and are not intended to be limiting unless otherwise specified.

EXAMPLES

Several experimental results in the laboratory, including tests with operating engines, indicate the potential of the AHC coating for reducing deposits on engine components. The engine valves were specifically coated using the PE-CVD method described above.

Example 1

With regard to engine tests, a 6-cylinder, four stroke, spark ignited engine manufactured by Ford Motor Company having a total piston displacement of 3.0 liter and a compression ratio of 10 was run for 300 hours in a high speed durability test. The fuel utilized constituted 85% unleaded gasoline and 15% methanol. Notably, the fuel contained no special additives for reducing the deposits. The engine was provided with three coated intake and exhaust valves and three uncoated intake and exhaust valves, two valves per cylinder. In a direct comparison of the coated and uncoated valves, the coated valves showed a distinct reduction of the black, gummy carbonaceous deposits.

Example 2

A second engine test was performed with coated intake and exhaust valves on a turbo-charged 2.2 liter, four valve per cylinder, four stroke, spark-ignited engine. The engine was run for 300 hours in a durability cycle using conventional leaded fuel with no special additives to prevent deposits. Following the test, no deposits were observed on the Si:AHC coated valves after the test. In comparison, a substantial layer of carbonaceous deposits is generally observed after similar tests with the same engine and similar fuel composition, where the valves are devoid of the Si:AHC coating.

An additional aspect of the first engine test was the visual observation of no significant wear on the coated valve in the region of the valve head which contacts the valve seat, whereas there was significant wear in the case of the uncoated valve. In the case of the uncoated valve, the wear was quantified by the measurement of the tip height increase of 0.015 inches over the 300 hour durability test.

While engine tests are, of course, the most conclusive evidence of the efficiency of these carbon coatings, laboratory tests are supportive, and if correlated with engine tests, can provide quick verification of changes in the coating process which can optimize the coating for reducing deposits, such as operation at a different self bias voltage or changing the precursor gas. One laboratory test that provides such a verification, is that of measuring the contact angle which water and/or other organic liquids make with the coated surface in question as process parameters are altered.

With the contact angle test, the attractive forces, or the adhesive energy between the liquid drop resting on a particular surface is revealed by the contact angle which the liquid makes with that surface. The greater the contact angle, the less the adhesion within the limitations of the test as is discussed, for example, in "Network Modifications Of DLC Coatings To Adjust A Defined Surface Energy" by K. Trojan, et al, in PHYSICS STATUS SOLIDI, Volume 145(a), p. 575, 1994.

Figure 4:
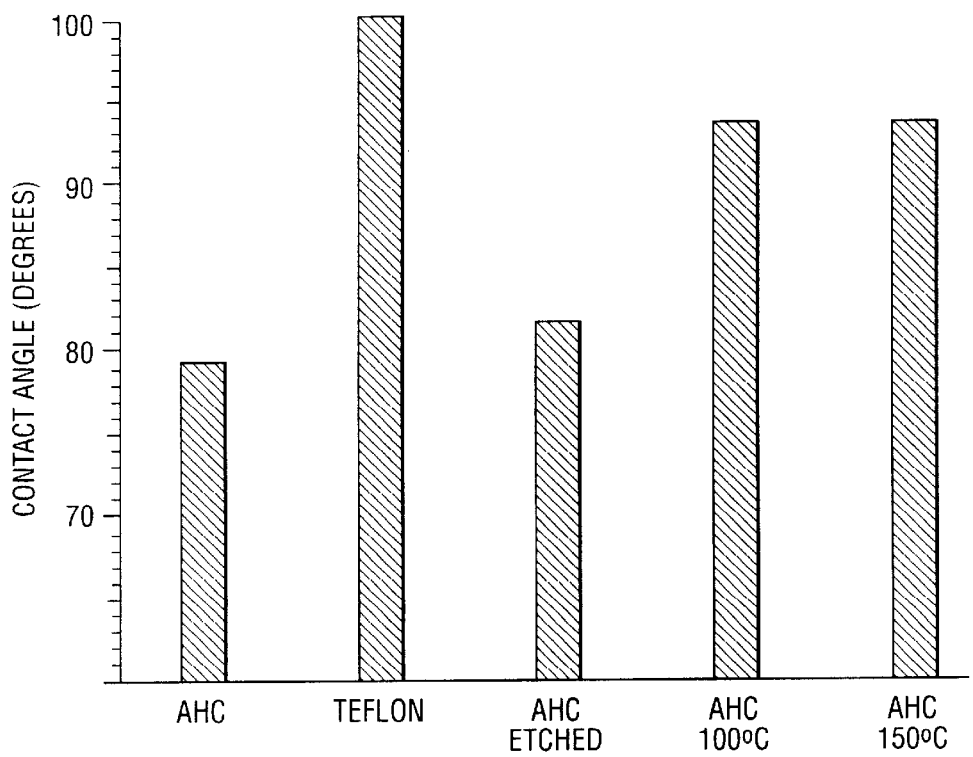
FIG. 4 shows a plot of the contact angle for a distilled water drop on the surface of the Si:AHC coating before and after a number of treatments to the surface compared to the same measurement for a Teflon® coated substrate.

FIG. 4 shows a plot of the contact angle of distilled water droplets on a number of surfaces, including Teflon®, Si:AHC, and the latter surface subjected to immersion in hydrofluoric acid solution (10% by volume), and subsequently heated for 15 minutes to between 100 and 150° C., respectively, in air. The results indicated that the Teflon®, which is a well-known coating due to its low wetability and low adhesive energy, has a larger contact angle than Si:AHC, but that the contact angle with the latter can be modified by surface treatment in hydrofluoric acid which causes the contact angle to increase. In this case, the chemical treatment might be expected to replace the hydrogen and carbon-hydrogen or silicon-hydrogen bonds near the surface of the coating with fluorine. Extrapolating from the case of Teflon®, fluorinated hydrocarbon, this in turn might be expected to reduce wetability and increase the contact angle as is observed. The high contact angles after heat treatments and air at 100° to 150° C. suggests that chemical reactions with air, such as oxidation reactions of the surface that must eventually occur at some elevated temperature and possibly enhance the adhesion properties of the coating, are not present up to this temperature. Accordingly, the contact angle measurement supports the observation of low adhesion, while offering a laboratory method for refining the coating process.

While the foregoing experiments involved the application of a silicon-doped amorphous hydrogenated carbon film, the result is entirely consistent with the understanding that other amorphous hydrogenated carbon films and doped amorphous hydrogenated carbon films may be used to prevent the formation of carbonaceous deposits on engine components as well. Included among this group of doped amorphous hydrogenated carbon films are tantalum-doped amorphous hydrogenated carbon, titanium-doped amorphous hydrogenated carbon, tungsten-doped amorphous hydrogenated carbon, niobium-doped amorphous hydrogenated carbon, silicon-doped amorphous hydrogenated carbon, boron-doped amorphous hydrogenated carbon, nitrogen-doped amorphous hydrogenated carbon, oxygen-doped amorphous hydrogenated carbon and fluorine-doped amorphous hydrogenated carbon.

While the best mode and viable alternate embodiments for carrying out the invention have been described in detail as shown on the drawings, those familiar in the art to which this invention relates will recognize various alternative designs and embodiments for practicing the invention as defined by the following claims.

What is claimed is:

1. A deposit-resistant internal combustion engine component, comprising:

a coating on at least one surface of the engine component, said surface being susceptible to deposit formation; and said coating selected from the group consisting of amorphous hydrogenated carbon and doped amorphous hydrogenated carbon whereby said coating prevents deposit formation on the engine component.

2. The engine component of claim 1, wherein said doped amorphous hydrogenated carbon is selected from the group consisting of silicon-doped amorphous hydrogenated carbon, boron-doped amorphous hydrogenated carbon, nitrogen-doped amorphous hydrogenated carbon, oxygen-doped amorphous hydrogenated carbon, fluorine-doped amorphous hydrogenated carbon, niobium-doped amorphous hydrogenated carbon, tungsten-doped amorphous hydrogenated carbon, titanium-doped amorphous hydrogenated carbon and tantalum-doped amorphous hydrogenated carbon.

3. The engine component of claim 1, wherein said coating is 200 angstroms to 10 microns in thickness.

4. The engine component of claim 1, wherein said coating is 2 to 4 microns in thickness.

5. The engine component of claim 1, wherein said coating is applied by a chemical vapor deposition technique.

6. The engine component of claim 1, wherein said amorphous hydrogenated carbon coating is formed from a hydrocarbon source.

7. The engine component of claim 1, wherein said hydrocarbon source includes at least one of the following: ethane, ethylene, acetylene, methane, butane, propane, hexane, benzene, toluene and xylene.

8. A deposit-resistant engine component for internal combustion engines, comprising:

a silicon doped amorphous hydrogenated carbon coating on at least one surface of the engine component, said surface being susceptible to deposit formation whereby said coating prevents deposit formation on the engine component.

9. The engine component of claim 8, wherein said engine component is applied by a chemical vapor deposition technique using a silicon precursor gas.

10. The engine component of claim 9, said silicon precursor gas selected from the group consisting of: diethylsilane, silicon tetrachloride, silicon tetrafluoride, trichlorosilicon, and tetramethylsilicon.

11. The engine component of claim 8, wherein said coating comprises hydrogen in concentrations of 20–60 atomic percent.

12. The engine component of claim 8, wherein said coating comprises hydrogen in concentrations of 35–50 atomic percent.

13. The engine component of claim 8, wherein said coating yields a broad band at around 1550 $cm^{-1}$ and a shoulder band at around 1400 $cm^{-1}$ when detected by laser Raman spectroscopy.

14. A method of providing a deposit-resistant coating for an engine component of an internal combustion engine, comprising:

preparing at least one surface of the engine component to be coated to create an adherent surface;

applying a coating on said surface, wherein said coating is selected from the group consisting of amorphous hydrogenated carbon and doped amorphous hydrogenated carbon such that said coating prevents deposit formation on the engine component.

15. The method of claim 14, wherein said step of applying a coating further comprises:

placing the engine component in a vacuum chamber;

evacuating gas within said vacuum chamber;

establishing a reactive gas mixture within said vacuum chamber, wherein said reactive gas mixture is selected from the group consisting of gaseous silicon compounds, gaseous hydrocarbon compounds and mixtures thereof; and establishing a plasma discharge within said vacuum chamber, such that the engine component is an electrode in said plasma discharge and a coating is deposited on the engine component.

16. The method of claim 14, wherein said step of applying a coating is maintained at a temperature less than 200 C. to avoid thermal alterations of the engine component.

17. The method of claim 14, wherein said reactive gas mixture comprises diethylsilane and methane.

18. The method of claim 14, wherein said doped amorphous hydrogenated carbon is selected from the group consisting of silicon-doped amorphous hydrogenated carbon, boron-doped amorphous hydrogenated carbon, nitrogen-doped amorphous hydrogenated carbon, oxygen-doped amorphous hydrogenated carbon, fluorine-doped amorphous hydrogenated carbon, niobium-doped amorphous hydrogenated carbon, tungsten-doped amorphous hydrogenated carbon, titanium-doped amorphous hydrogenated carbon and tantalum-doped amorphous hydrogenated carbon.

* * * * *